United States Patent
Wang et al.

(10) Patent No.: US 7,463,831 B2
(45) Date of Patent: Dec. 9, 2008

(54) TRANSPONDER ASSEMBLY FOR USE WITH PARALLEL OPTICS MODULES IN FIBER OPTIC COMMUNICATIONS SYSTEMS

(75) Inventors: William Wang, Pleasanton, CA (US); Hengju Cheng, Mountain View, CA (US); WeiZen Lo, Cupertino, CA (US)

(73) Assignee: Stratos International, Inc., Chicago, IL (US)

( * ) Notice: Subject to any disclaimer, the term of this patent is extended or adjusted under 35 U.S.C. 154(b) by 264 days.

(21) Appl. No.: 11/350,432

(22) Filed: Feb. 9, 2006

(65) Prior Publication Data

US 2006/0133820 A1    Jun. 22, 2006

Related U.S. Application Data

(62) Division of application No. 10/237,823, filed on Sep. 6, 2002, now Pat. No. 7,064,962.

(51) Int. Cl.
*H04B 10/00* (2006.01)

(52) U.S. Cl. .................. 398/164; 361/789; 361/730; 361/785; 361/788

(58) Field of Classification Search .............. None
See application file for complete search history.

(56) References Cited

U.S. PATENT DOCUMENTS

| 5,852,257 | A | 12/1998 | Dittman et al. ............... 174/59 |
| 5,982,633 | A | 11/1999 | Jeansonne ................. 361/782 |
| 6,075,634 | A | 6/2000 | Casper et al. ............... 359/152 |
| 6,417,463 | B1 | 7/2002 | Cornelius et al. ........... 174/263 |
| 6,809,421 | B1 | 10/2004 | Hayasaka et al. ........... 257/777 |
| 2002/0105702 | A1* | 8/2002 | Snawerdt .................... 359/173 |

* cited by examiner

*Primary Examiner*—David E Graybill
(74) *Attorney, Agent, or Firm*—Karl D. Kovach

(57) ABSTRACT

A transponder assembly for use with fiber optic digital communication cables having multiple parallel optic fiber elements. The transponder assembly features a transmitter port and receiver port for connection with separate parallel optic cables for separately transmitting and receiving data and an electrical connector for connecting with computer or communication systems. The transponder assembly includes a parallel optic transmitter module and a parallel optic receiver module having pluggable edge connectors. The assembly also includes a circuit board on which a semiconductor chip useful for signal processing and the electrical connector are mounted. A flex circuit is used in connecting the circuit board to the parallel optic modules. The semiconductor chip and electrical connector are mounted directly across from one another on opposite surfaces of the circuit board.

5 Claims, 9 Drawing Sheets

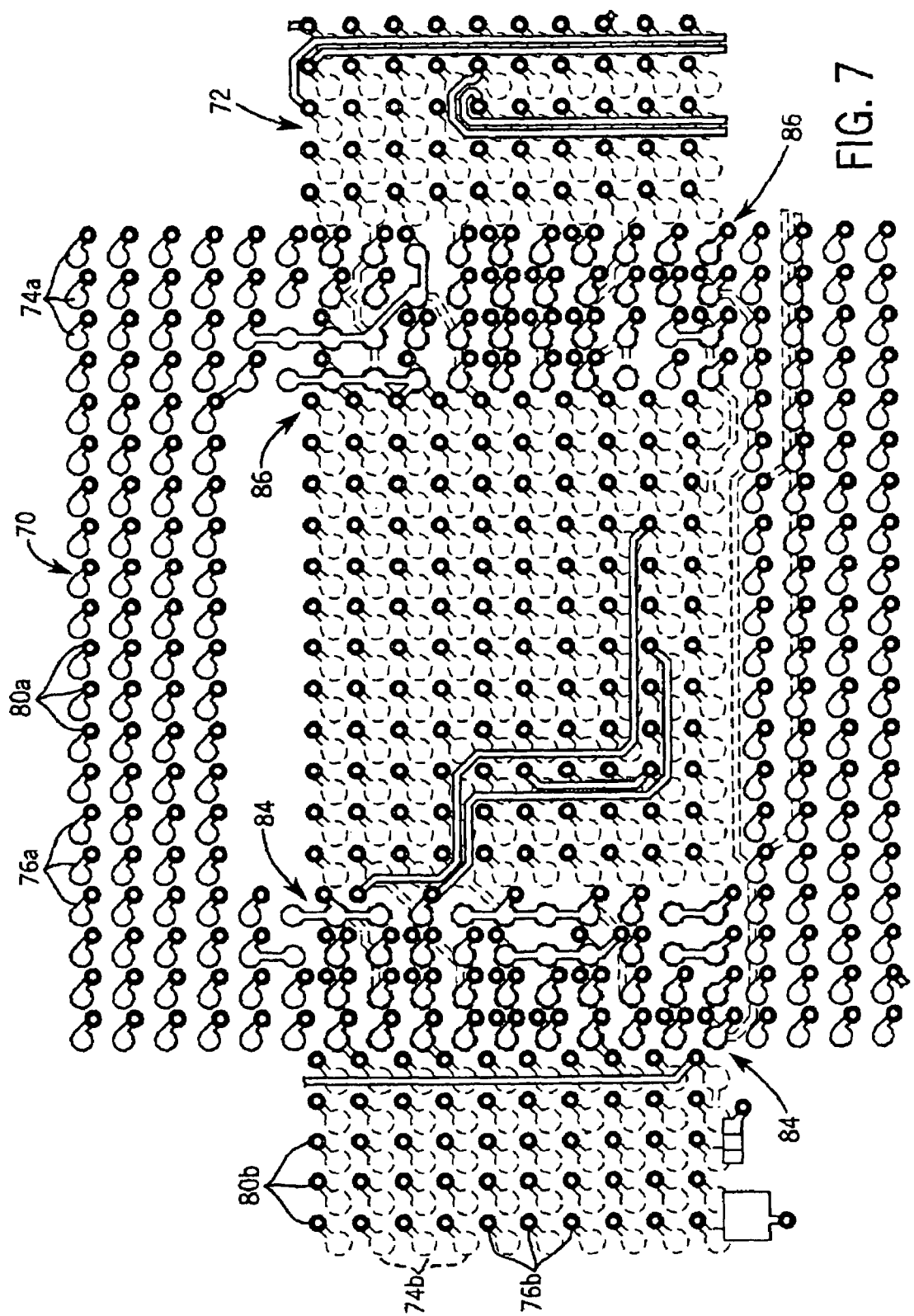

TRANSPONDER ASSEMBLY FOR USE WITH PARALLEL OPTICS MODULES IN FIBER OPTIC COMMUNICATIONS SYSTEMS

This is a division of application Ser. No. 10/237,823, now U.S. Pat. No. 7,064,962, filed Sep. 6, 2002, which is hereby incorporated herein by reference.

BACKGROUND OF THE INVENTION

1. Field of the Invention

The present invention relates to the use of optoelectronic components in fiber optic digital communication networks and, more particularly, to transponder assemblies which transmit and receive optical signals over fiber optic ribbon cables having multiple fiber optic elements.

2. Discussion of the Background

The majority of computer and communication networks in use today rely on copper wiring to transmit data between network nodes. However, electrical signals carried by copper wiring have a limited capacity for carrying digital data.

Many computer and communication networks, including large parts of the Internet, are now being built using fiber optic cabling that can be used to transmit much greater amounts of data. With fiber optic elements, data is transmitted using optical signals (sometimes referred to as photonic signals) having greater data carrying capacity.

However, since computers use electrical signals as opposed to optical signals, the light signals used to transmit data over fiber optic links must be translated to electrical signals and vice-versa during the optical communication process. Building such fiber optic networks therefore requires optoelectronic modules which electrically and optically interface optical transmission mediums such as fiber optic cables with electronic computing and communications devices. Further, in order to provide the required bandwidth for very high-speed communications, fiber optic ribbon cables having multiple fiber optic elements and so-called "parallel optics" modules adapted for concurrently transmitting or receiving multiple signals over such may also be used.

The optoelectronic modules associated with fiber optic networks should therefore be adapted for accommodating fiber optic ribbon cables having multiple fibers. Further, it is desirable for separate parallel optic transmitter and receiver modules to be incorporated in transponder assemblies which can separately transmit and receive optical data over separate cables using the transmitter and receiver modules. However, for most applications these transponder assemblies must be compact and should utilize only the smallest possible footprint on the circuit boards within the electronic computing or communications devices with which the fiber optic network is interfacing.

SUMMARY OF THE INVENTION

The transponder assembly of the present invention comprises a small form factor system for interfacing between computer and communication systems and fiber optic cables having multiple fiber elements while providing concurrent electrical-to-optical and optical-to-electrical conversion functionality. The transponder assembly features a pair of optical communication ports one of which functions as a transmitter port and the other of which functions as a receiver port for interconnecting with parallel optics fiber optic ribbon cables. The transponder assembly also features a pin-array electrical connector for interconnecting with corresponding connectors installed on the circuit boards of the electrical computer and communications systems being interfaced with.

The transponder assembly includes a parallel optics transmitter module and a parallel optics receiver module having pluggable edge connectors. The assembly also includes a circuit board mounting a Serializer/Deserializer (SerDes) chip and the pin-array type electrical connector. A flexible printed circuit or Flex circuit is used to flexibly connect the circuit board to a connector board mounting a pair of connection jacks which interconnect with the edge connectors of the parallel optics modules. The Flex circuit allows the alignment of the circuit board and parallel optics modules to be adjusted for providing an assembly having minimum depth dimensions. The SerDes chip and pin-array connector are mounted directly across from one another on opposite surfaces of the circuit board using ball grid arrays having areas in which their attachments are positioned in between one another in the overlapping areas. The solder pads associated with the vias having the same connection functionality are interconnected by surface traces and redundant vias are eliminated in order to allow adequate pathways for circuit traces to within the circuit board structure to extend through the overlapping areas of the ball grid array attachments. Placement of the pin-array connector and the SerDes chip across from one another on the circuit board allows for an assembly having minimum lateral dimensions.

It is an object of the present invention to provide a transponder assembly adapted for use with fiber optic ribbon connectors having multiple fiber optic elements.

It is another object of the present invention to provide a transponder assembly which utilizes separate parallel optic transmitter and receiver modules in an assembly having a compact size and minimum footprint.

It is a further object of the present invention to provide for the internal components of a parallel optics transponder assembly to be flexibly interconnected whereby a compact size can be achieved.

It is yet another object of the present invention to provide for a semiconductor chip and an electrical connector to be positioned directly across from one another on the same circuit board using ball grid array attachments on opposite surfaces of the same circuit board to electrically interconnect the semiconductor chip, electrical connector and circuit board.

It is a yet further object to provide an efficient and effective parallel optics transponder assembly featuring a compact size and small footprint.

BRIEF DESCRIPTION OF THE DRAWINGS

The invention and its advantages may best be understood by reference to the following description taken in conjunction with the accompanying drawings, wherein:

FIG. 7 is an overhead, plan view of the circuit board on which the SerDes chip and pin array connector are mounted showing the ball grid array attachment structures associated with the SerDes chip and the pin array connector;

Referring now to FIG. 13, similar to FIG. 4, shown is the receiving parallel optics module 32, including the frame 45, the heat sink 50, and the small circuit board 52. Also shown are the electrical connection jack 62, the Flex circuit 34, the microchip 54, the ball grid array attachments 70, the rigid circuit board 36, the bottom surface 66 of the rigid circuit board 36, the top surface 64 of the rigid circuit board 36, the pin array electrical connector 18, and the ball grid array attachments 72.

DETAILED DESCRIPTION OF THE INVENTION

The present invention will now be described in detail with reference to preferred embodiments as illustrated in the accompanying drawings. In the following description, numerous specific details are set forth in order to provide a thorough understanding of the present invention. However, it should be apparent to one skilled in the art that the present invention may be practiced without some or all of these specific details. In other instances, it should be appreciated that well-known process steps have not been described in detail in order to not obscure the present invention.

Figure 1:
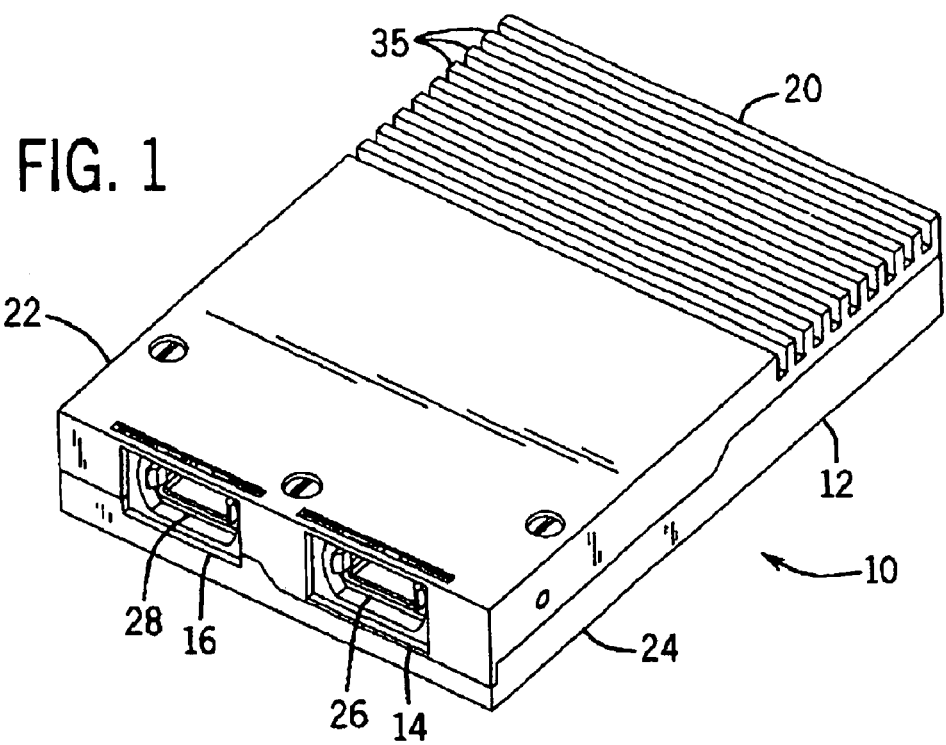
FIG. 1 is an overhead, perspective view of a transponder assembly constructed in accordance with the principles of the present invention primarily showing the communication ports by which the assembly can be optically connected to a pair of fiber optic ribbon cables for separately transmitting and receiving digital data over separate cables.
Figure 2:
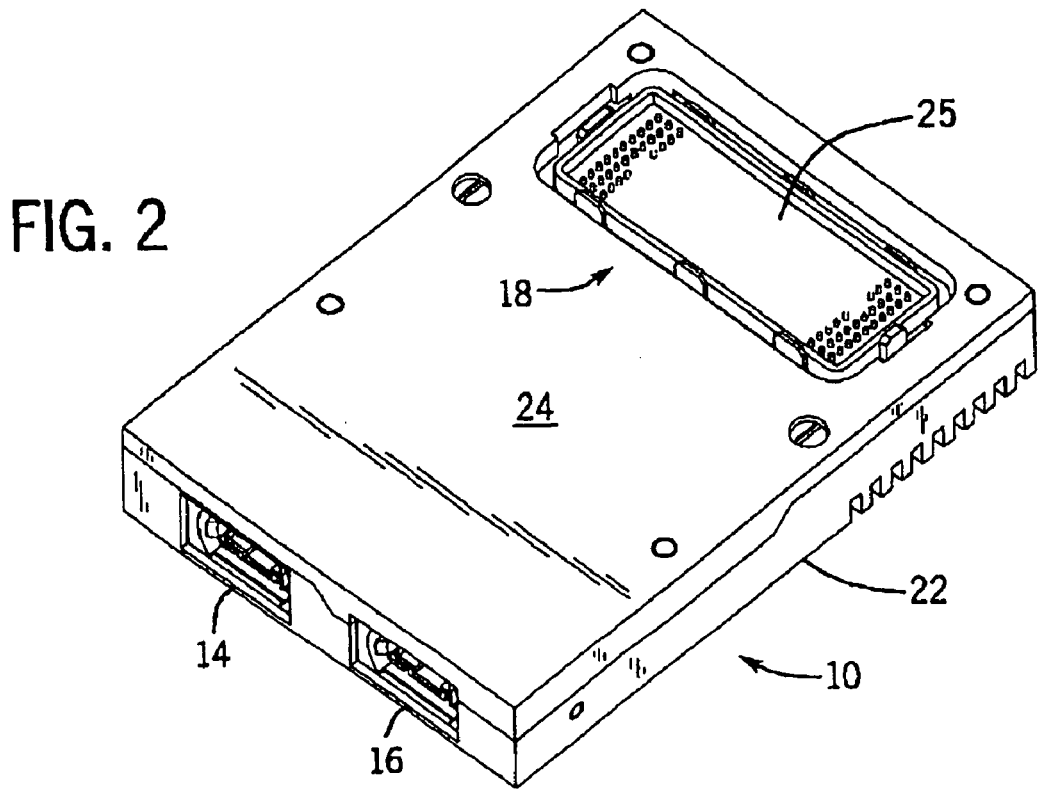
FIG. 2 is a perspective view of the underside of the transponder assembly shown in FIG. 1 primarily showing the pin-array connector for electrically connecting the assembly to a circuit board or the like of a computer or communications system.

Referring now to FIGS. 1 and 2, a transponder assembly 10 is shown as including a two-piece housing 12, two communication ports 14 and 16, a pin-array type electrical connector 18 and a heat sink 20. The pin-array connector 18 is preferably a 300-pin MEG Array™ electrical connector (which may be purchased from FCI USA, AREVA Group, having US offices at 825 Old Trail Road in Etters, Pa., 17319). The two-piece housing 12 includes a top section 22 and a bottom section 24 which are fitted together to form a small form factor case enclosing the operational modules of the transponder assembly 10. The communication ports 14 and 16 reside on its front side of the assembly 10 and include parallel optical link receptacles 26 and 28 which are part of parallel optics modules 30 and 32 (not otherwise shown in FIGS. 1 and 2) deployed within the transponder 10. The receptacles 26 and 28 are designed to mate with standard MTP™ (MPO) connectors (Optical Internetworking Forum, OIF-VSR4-03.0) of fiber optic ribbon cables containing twelve parallel fibers and presenting twelve fiber optic terminations for optical interconnection. The pin-array connector 18 resides on the underside of the transponder assembly 10 and includes a 300-pin plug housing 25 for connecting to a printed circuit board or other electrical assembly having a matching pin-array receptacle housing. The port 14 is associated with the parallel transmitter module 30 which is adapted for converting electrical signals into optical signals and transmitting these signals into a fiber optic ribbon cable connector. The port 16 is associated with the parallel optics receiver module 32 which is adapted for receiving optical signals from a fiber optic ribbon cable connector and converting the same into electrical signals. The ports 14 and 16 thereby provide transmitter and receiver links so that the transponder 10 can both receive and transmit data over separate twelve fiber element parallel optic ribbon cables. The heat sink 20 includes a set of ribs 35 to allow for improved heat dissipation through the surface of the housing 12 from the active elements deployed inside the assembly 10.

The transponder 10 is designed to be compliant with OIF (Optical Internetworking Forum)-VSR4-01.0 implementation standard for optically transmitting OC-192 data and providing a parallel optics based VSR (Very Short Reach) OC-192/STM-64 interface. The transponder assembly 10 provides a bi-directional interface for multiplexing a sixteen-bit wide bus of 622 Mb/s electrical LVDS (Low-Voltage Differential Signal) signal data supplied from the pin-array connector 18 into twelve channels of optical signal data at 1.24 Gb/s for transmission as photonic signals over a twelve element optical ribbon cable and also for receiving twelve channels of optical signal data at 1.24 Gb/s and demultiplexing this data into a sixteen-bit wide bus of 622 Mb/s electrical LVDS signal data for supply to the pin-array connector 18. The transponder assembly 10 also includes an error detection channel and a protection channel among the twelve optical channels. The pin-array connector 18 is intended to interface to an OC-192 framer on the electrical assembly to which the transponder assembly 10 is connected.

Figure 3:
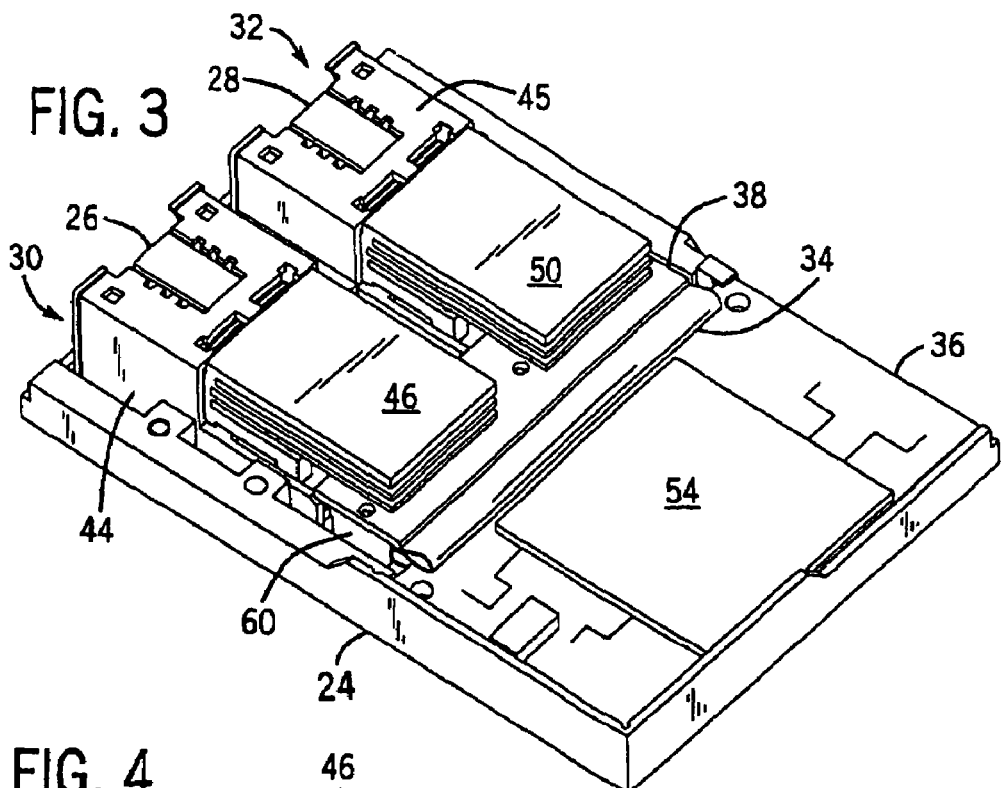
FIG. 3 is an overhead, perspective view of the transponder assembly of the present invention with the top section of the assembly housing removed showing the internal components within the transponder assembly and showing, among other things, the parallel optic transmitter and receiver modules within the assembly.

Referring now to FIG. 3, the transponder assembly 10 includes a parallel optics transmitter module 30, a parallel optics receiver module 32, a Flexible printed circuit or Flex circuit 34, a rigid circuit board 36 and connector board 38 all of which are mounted onto the bottom section 24 of the housing 12. The parallel optics transmitter module 30 provides an optical interface to a twelve fiber optic ribbon cable and includes a set of twelve VCSELs (Vertical Cavity Surface Emitting Lasers) for emitting optical signals in response to electrical signals which are directed into the twelve fibers of the ribbon cable and includes electrical circuitry for processing electrical signals received from a transmitter edge connector 40 and converting these signals into forms suitable for driving the VCSELs. The parallel optics receiver module 32 provides an optical interface to a twelve fiber optic ribbon cable and includes a set of twelve PIN diodes for responding to optical signals from the twelve fibers of the ribbon cable which are directed onto the diodes and converting these signals into electrical signals and includes electrical circuitry for processing the electrical signals into suitable forms for general use and supplying them to a receiver edge connector 42. The transmitter module 30 includes a frame 44 on which the receptacle 26, heat sink 46 and a small circuit board 48 are mounted. The circuit board 48 extends along the bottom of the module 30 and carries the edge connector 40 at its far end opposite the receptacle 26. The receiver module 32 is similarly constructed and includes a frame 45 on which the receptacle 28, heat sink 50 and a small circuit board 52 are mounted. The circuit board 52 extends along the bottom of the module 32 and carries the edge connector 42 at its far end opposite the receptacle 28. The Flex circuit 34 extends from the circuit board 36 to the connector board 38 and includes a large number of signal lines which interconnect the circuit board 36 to the connector board 38. The Flex circuit 34 is comprised of a flexible material such as a Polyimide material supporting thin metal traces as signal lines that can be curled into arcuate shapes while still preserving the integrity of its signal lines. The rigid circuit board 36 provides electrical circuitry for use in signal processing and includes a SerDes (Serializer/Deserializer) semiconductor chip 54 as well as other circuitry. The connector mounting board 38 serves as a host for a pair of electrical connection jacks 60 and 62 mounted on its underside for pluggably interconnecting with the edge connectors 40 and 42 of the parallel optic modules 30 and 32.

Figure 4:
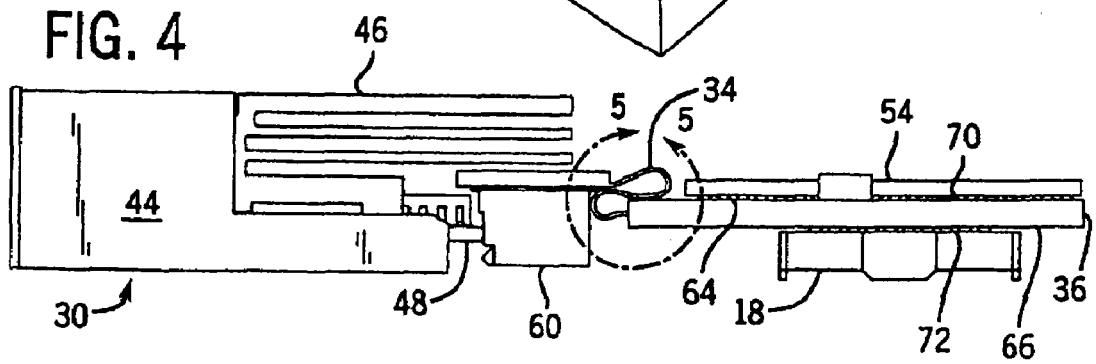
FIG. 4 is a side view of the internal components of the transponder assembly of the present invention showing, among other things, the parallel optic modules, a connector board with connection jacks, a Flex circuit and a rigid circuit board on which a SerDes chip and pin-array connector are mounted on opposing surfaces of the board.
Figure 5:
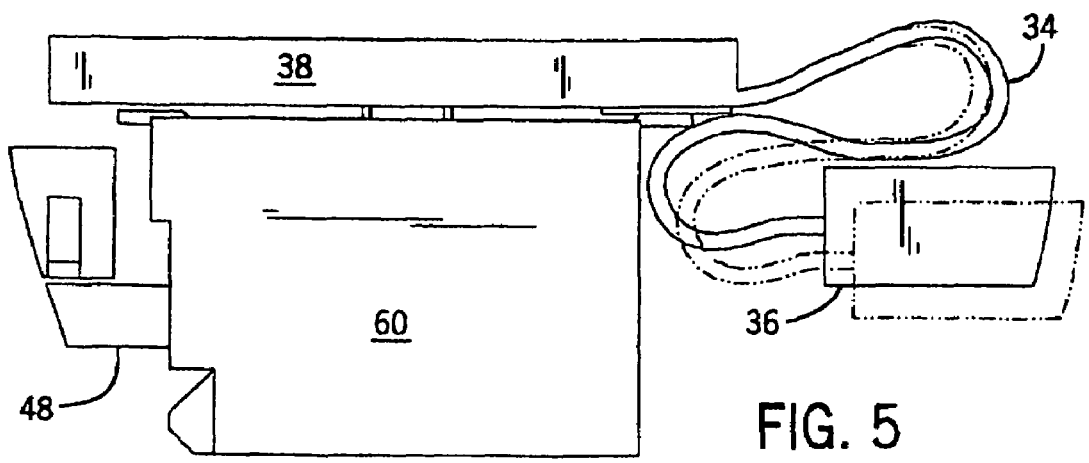
FIG. 5 is a close-up side view along lines 5-5 in FIG. 4 of the connector board, Flex circuit and rigid circuit board components primarily illustrating how these components are flexibly interconnected and aligned.

Referring now to FIGS. 4 and 5, the parallel optic modules 30 and 32 are connected to the connector board 38 by the edge connectors 40 and 42 carried on their circuit boards 48 and 52. The edge connectors 40 and 42 plug into sockets in the connection jacks 60 and 62 mounted onto the connector board 38. The connector board 38 and connection jacks 60 and 62 are constructed and arranged so that they are reversed with respect to their standard orientation for mounting a parallel optic module on a circuit board. The connector board is flipped over and extends inward to the center of the assembly 10 and away from its perimeter defined by the housing 12. A more compact configuration is provided by having the orientation of the connector board 38 reversed so that it does not impinge on the housing perimeter thereby forcing an increase in housing size. It should be noted that the module 32, edge connector 42, circuit board 52 and connection jack 62 are not shown in FIGS. 4 and 5 but are positioned directly behind the module 30, edge connector 40, circuit board 48 and connection jack 60. However, discussion of the invention with reference to the module 30, edge connector 40, circuit board 48 and connection jack 60 as illustrated in the drawings should serve to fully explain the invention. The connector board 38 is in turn connected to the circuit board 36 by the Flex circuit 34. However, the Flex circuit 34 is curled into a multi-curved shape between the connector board 38 and circuit board 36 in order to allow the circuit board 36 to be deployed at a different level from the connector board 38. The plane defined by the position of circuit board 36 is intermediate between the planes defined by the positions of the connector board 38 and the circuit boards 48 and 52. Thus, the planes defined by the circuit board 36, the connector board 38, and the circuit boards 48, and 52, are not co-planar. This is of advantage since it allows the top of the circuit board 38 to define the top of the internal assembly within the housing 12 which otherwise would be defined at a higher level by the circuit board 36 thereby adding to the overall height of the module. Use of the Flex circuit 34 in interconnecting the modules 30 and 32 to the circuit board allows for a more compact assembly to be achieved which in turn provides a smaller form factor to the transponder assembly 10.

Referring now again to FIG. 4, the circuit board 36 includes the SerDes semiconductor chip 54 mounted on its top surface 64 and the pin-array connector 18 mounted on its bottom surface 66. The SerDes chip 54 and pin-array connector 18 are mounted directly across from one another on opposing surfaces of the circuit board 36. Both the SerDes chip 54 and the pin-array connector 18 are connected to the circuit board 36 by ball grid array attachments 70 and 72 on the opposite surfaces 64 and 66 of the circuit board 36.

Figure 6:
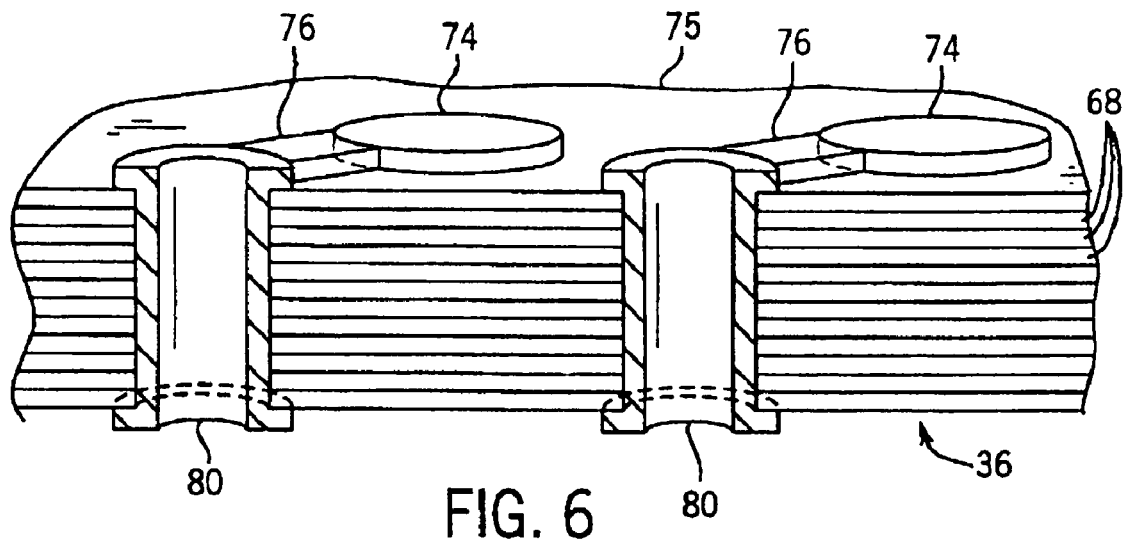
FIG. 6 is a close-up cross-sectional view of a typical section of the rigid circuit board on which the SerDes chip and pin-array connector are mounted showing an area in the vicinity of one of the ball grid arrays associated with either the chip or the connector.

Referring now to FIG. 6, a small section 75 of the circuit board 36 is shown in the vicinity of one of the ball grid array attachments. The circuit board has multiple layers 68 through which circuit traces may extend at multiple levels. This section 75 of the circuit board 36 includes two spaced apart attachment pads 74 on which solder may be deployed on the surface of the board 36 which are associated with the ball grid array. The pads 74 are connected by short circuit traces 76 to a metal plated vias 80 which extend entirely through the board 36 from surface to opposite surface. This construction is characteristic of ball grid arrays and allows the pads 74 to be selectively connected to circuit traces at any of the layers 68 of the board 36 by way of the traces 76 and metal plated vias 80.

Referring now to FIG. 7, the attachment pads 74, connection traces 76 and vias 80 associated with each of the ball grids array attachments are shown. It should be borne in mind that the circuit board 36 is not shown in this view and that the vias 80 extend through the circuit board 36 while the attachment pads 74 and traces 76 for each of the attachments 70 and 72 are resident on opposite surfaces of circuit board 36. The ball grid array attachment 70 for the SerDes chip is shown as having two-hundred-fifty-six pads in a square pattern. The ball grid array attachment 72 for the pin-array connector 18 is shown as having three-hundred pads in a rectangular pattern. The patterns formed by the attachments 70 and 72 define two overlapping areas 84 and 86 characterized by high densities of pads and associated traces and vias. Surface traces such as traces 76 may be used to connect to discrete surface mounted components.

Figure 8:
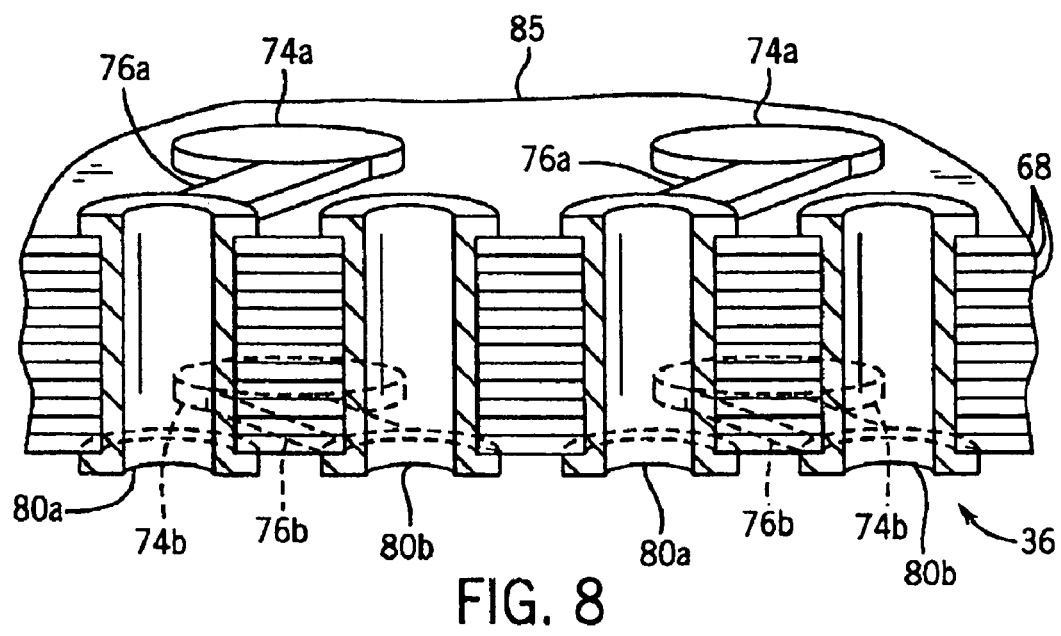
FIG. 8 is a close-up cross-sectional view of a typical section of the rigid circuit board on which the SerDes chip and pin-array connector are mounted showing an area of overlap between both of the ball grid arrays associated with the SerDes chip and pin-array connector.

Referring now to FIG. 8, a small section 85 of the circuit board 36 is shown in the overlapping area 84. This section 85 of the circuit board 36 includes two spaced apart pads 74a on the surface 64 of the board 36 associated with the ball grid array attachment 70. The pads 74a are connected by short circuit traces 76a to a metal plated vias 80a which extend entirely through the board 36 from one surface to its opposite surface. This section 85 of the circuit board 36 also includes two spaced apart pads 74b (in phantom) on the surface 66 of the board 36 associated with the ball grid array attachment 72. The pads 74b are connected by short circuit traces 76b (in phantom) to a metal plated vias 80b which extend entirely through the board 36 from one surface to its opposite surface. The vias 80a and 80b are deployed in an alternating pattern so that the vias of one array attachment are positioned in between the vias of the other array attachment. In this manner all of the vias 80 for ball grid arrays attachments 70 and 72 can be accommodated in the available space.

Figure 9:
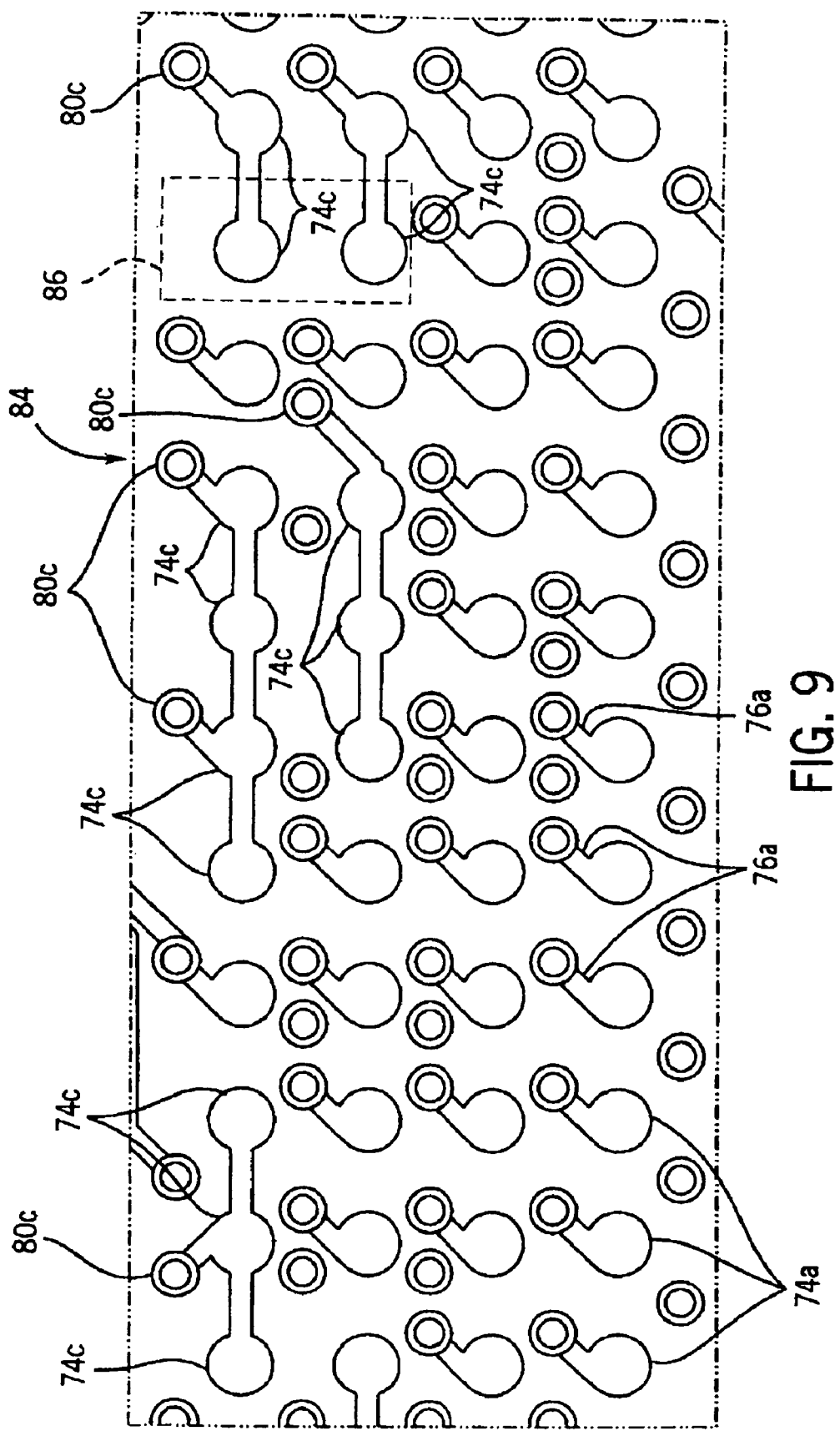
FIG. 9 is a close-up overhead, plan view of the circuit board on which the SerDes chip and pin array connector are mounted exclusively showing ball grid array attachment structures associated with both the SerDes chip and pin-array connector in one of the overlapping areas between the ball grid arrays and their attachment structures.

Referring now to FIG. 9, the overlapping area 84 is shown as including vias 80 associated with each of the ball grid array attachments 70 and 72 but only pads 74a and traces 76a associated with the attachment 70. The vias 80c are connected to multiple pads 74a in cases where the circuit functionality allows for such interconnections. Certain vias may thereby be eliminated as redundant which allows for simpler construction. More importantly, it allows circuit traces at multiple levels in the circuit board 36 to extend through the via-free pathways, such as space 86, thereby created for establishing connections within the board 36.

Figure 10:
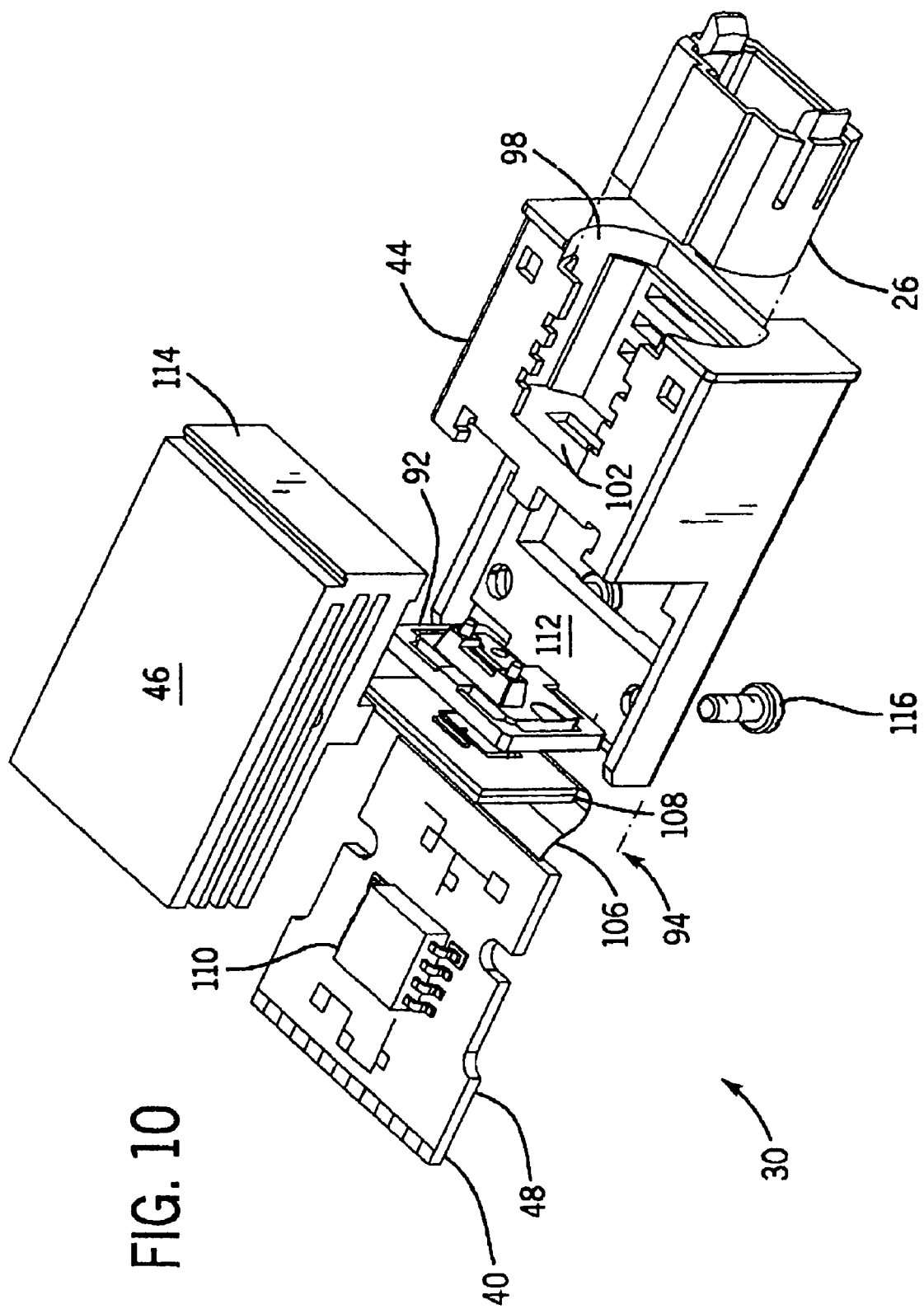
FIG. 10 is an exploded, overhead perspective view of a parallel optics module, the transmitter module, which comprises one of the primary components of the transponder assembly of the present invention showing, among other things, how the receptacle, lens and alignment frame, carrier frame section, circuit board, edge connector and the other components and sub components of the module relate to one another.
Figure 12:
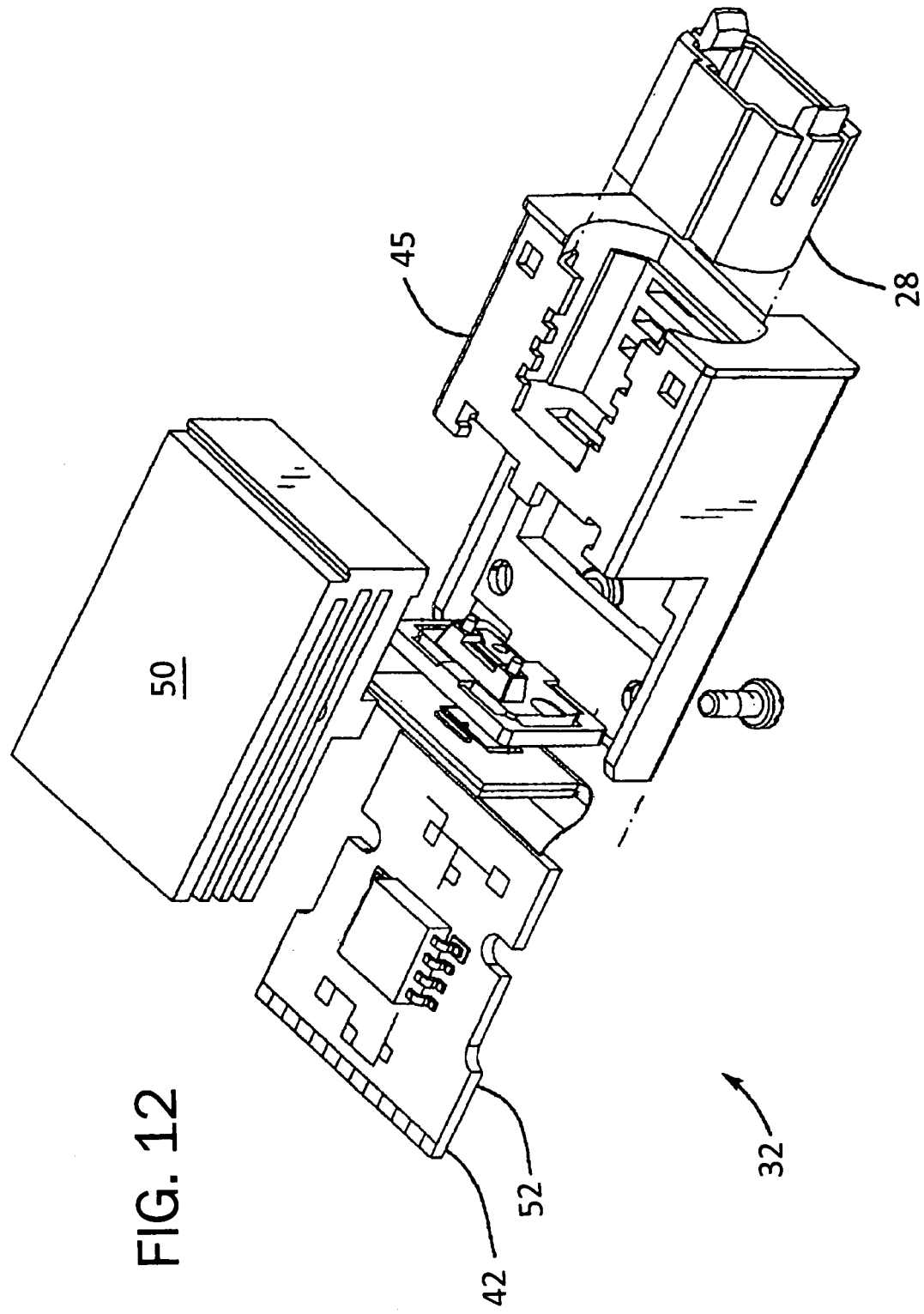
FIG. 12 is an exploded, overhead perspective view of the other parallel optic module, the receiver module.
Figure 13:
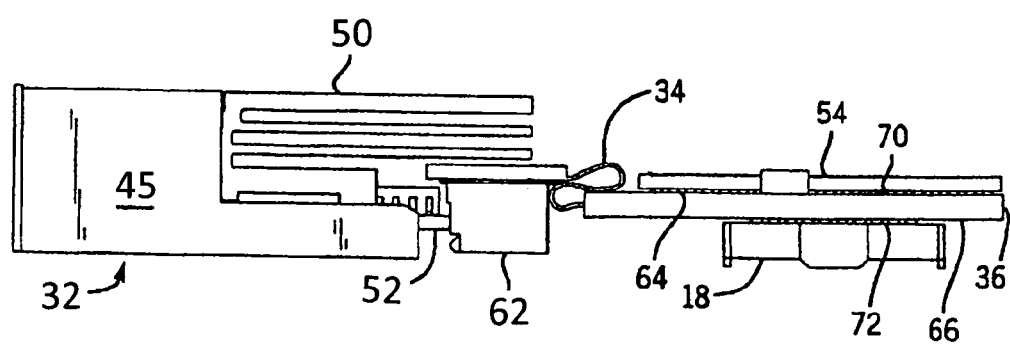
FIG. 13 is a side view of the internal components of the transponder assembly of the present invention showing, among other things, the parallel optics receiver module.

Referring now to FIG. 12, similar to FIG. 10, shown is the receiving parallel optics module 32, including the frame 45, the heat sink 50, the small circuit board 52, and the parallel optical link receptacle 28. The small circuit board 52 includes the edge connector 42.

Figure 11:
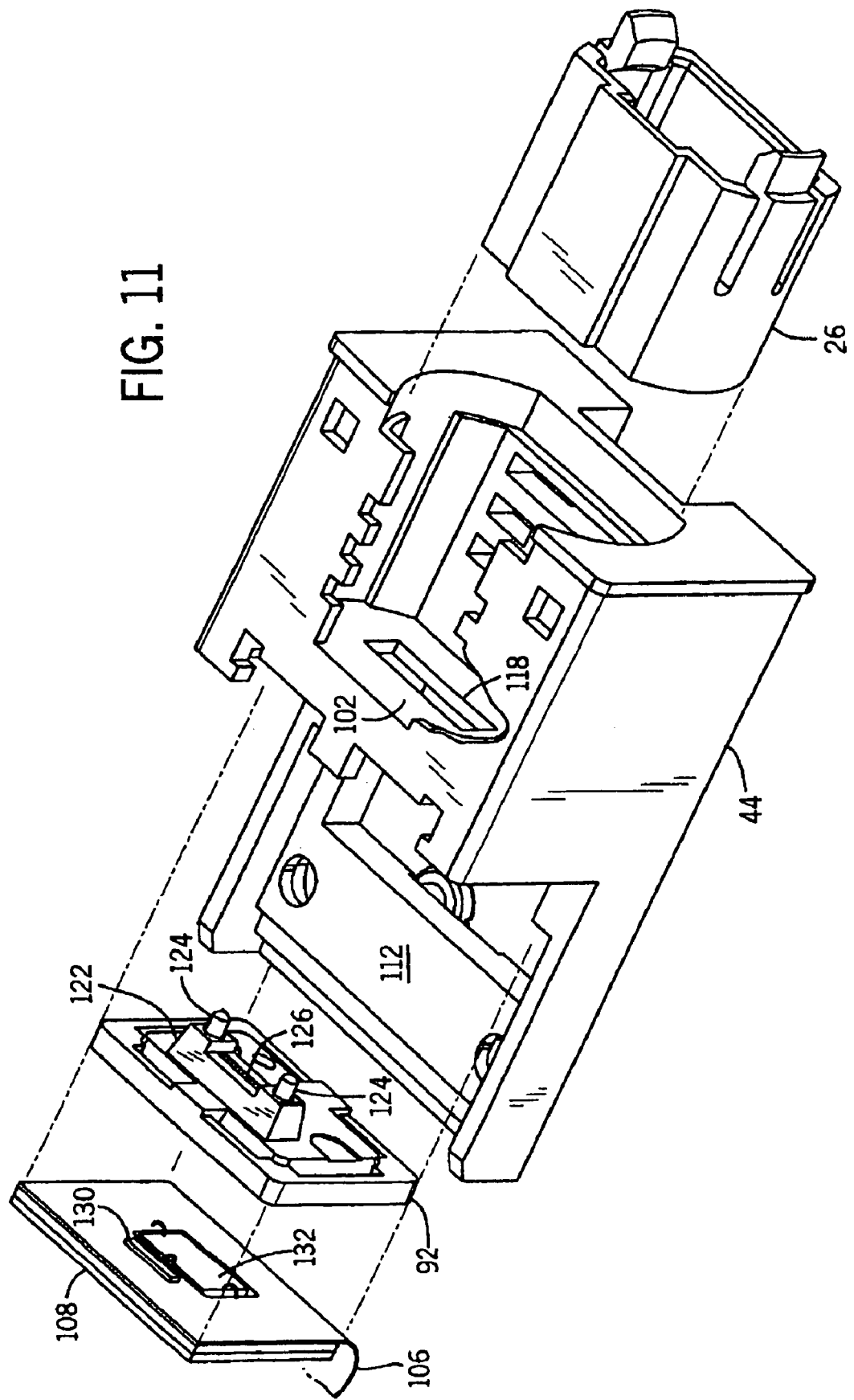
FIG. 11 is an enlarged exploded, overhead perspective view of the forward portion of the module shown in FIG. 10 primarily showing, how the receptacle, lens and alignment frame, carrier frame section and their subcomponents relate to one another.

Referring now to FIGS. 10 and 11, a typical parallel optic (transmitter) module 30 is shown in greater detail as including the receptacle 26, metal support frame 44, lens and alignment frame 92, carrier assembly 94, and heat sink 46. It should be noted that the receiver module 32 would be similar in design and construction to the transmitter module 30 except that it would contain photoactive elements operative for receiving signals such as PIN diodes and associated circuitry as opposed to transmitter elements such as VCSELs. The receptacle 26 is mounted in the recess 98 in the support frame 44 so that it abuts the back wall 102 of the frame 44. The carrier assembly 94 includes the printed circuit board 48, the module Flex circuit 106 and the carrier frame section 108. The lens and alignment frame 92 is mounted in between the frame section 108 of the carrier assembly 94 and the back wall 102 of the support frame 44 so that it is immediately adjacent to the fiber ends on the proximal end of the connector ferrule for the fiber optic ribbon cable when the ferrule is latched into the module 30. The Flex circuit 106 connects the frame section 108 to the circuit board 48 serving as a medium for providing a large number of connection lines between components on the carrier frame section 108 and the circuit board 48 including the microcontroller chip 110 and the edge connector 40. The circuit board 48 fits along the back shelf 112 of the support frame 44 underneath the heat sink 46. The front end 114 of the heat sink 46 abuts the backside of the carrier frame section 108 for dissipating heat generated during operation by the electrical components mounted onto the frame section. The bolts 116 help retain the heat sink 46 and circuit board 48 in position within the frame 44. The support frame 44 includes a window 118 in its back wall 102. The lens and alignment frame 92 includes a mostly planar base 120 and a rectangular tower structure 122 projecting forward of the base 120 on which guide pins 124 and a lens array 126 are mounted. The tower structure 122 of the lens and alignment frame 92 fits through the window 118 of the support frame 44 in the assembled device. The lens and alignment frame 92 is a one-piece precision plastic injection-molded part including the tower structure 122, guide pins 124 and lens array 126. The carrier frame section 108 of the carrier assembly 94 preferably includes one or more layers of printed circuit board material including a layer of Flex circuit material which is an extended part of the Flex circuit 106. An optoelectronic device 130 containing photoactive semiconductor components is precisely mounted on the frame section 108. The device 130 comprises an integrated circuit chip which contains twelve VCSELs which are deployed on and as part of the chip. The photoactive components are disposed in a linear array at regular intervals corresponding to the lens array 126 and the array of fibers in the fiber optic ribbon cable connector. When the lens and alignment frame 92 is mounted on the frame section 108 the optoelectronic device 130 and its photoactive components (VCSELs) are precisely aligned with the lens array 126 and the guide pins 124. One or more signal processing chips 132 may be mounted on the carrier frame section 108 for communicating with the optoelectronic device 130 and more particularly providing drive signals to transmitter elements (or providing signal amplification and conditioning in the case of receiver elements).

Although only a few embodiments of the present inventions have been described in detail, it should be understood that the present invention may be embodied in other forms without departing from the overall spirit or scope of the present invention.

What is claimed is:

1. A transponder assembly having a housing, the transponder assembly comprising:
   a parallel optics receiver module having a receiver edge connector;
   a parallel optics transmitter module having a transmitter edge connector;
   a printed circuit board having a top surface and a bottom surface;
   a semiconductor chip mounted on the top surface of the printed circuit board, the semiconductor chip providing signal processing capabilities;
   an electrical connector mounted to the bottom surface of the printed circuit board;
   a connector board;
   a first electrical connection jack mounted on the connector board, the first electrical connection jack adapted for connecting with the receiver edge connector of the parallel optics receiver module;
   a second electrical connection jack mounted on the connector board, the second electrical connection jack adapted for connecting with the transmitter edge connector of the parallel optics transmitter module; and
   a flex circuit for connecting and interfacing the connector board with the printed circuit board.

2. A transponder assembly according to claim 1 wherein the electrical connector comprises a pin-array connector, and the semiconductor chip comprises a SerDes chip.

3. A transponder assembly according to claim 1 wherein the printed circuit board includes first and second overlapping ball grid array attachments for connecting the electrical connector and semiconductor chip with the printed circuit board.

4. A transponder assembly according to claim 1 wherein the parallel optics receiver module and the parallel optics transmitter module are adapted for interfacing with fiber optic ribbon cables containing twelve optical fibers.

5. A transponder assembly according to claim 1 wherein the printed circuit board forms a first plane, and the connector board forms a second plane, and wherein the first plane is different from the second plane.

* * * * *